(12) United States Patent
Takagi

(10) Patent No.: US 7,851,832 B2
(45) Date of Patent: Dec. 14, 2010

(54) SEMICONDUCTOR DEVICE

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 236 days.

(21) Appl. No.: 12/255,765

(22) Filed: Oct. 22, 2008

(65) Prior Publication Data

US 2009/0108357 A1 Apr. 30, 2009

(30) Foreign Application Priority Data

Oct. 26, 2007 (JP) .............................. 2007-278970

(51) Int. Cl.
*H01L 27/085* (2006.01)

(52) U.S. Cl. .............................. 257/287; 257/E29.116; 257/275; 257/289; 257/365; 438/193; 438/284

(58) Field of Classification Search .......... 257/E27.081, 257/E29.116, 275–277, 287, 289, 365, 713, 257/734; 438/193, 195, 284
See application file for complete search history.

(56) References Cited

U.S. PATENT DOCUMENTS

| | | | | |
|---|---|---|---|---|
| 5,734,189 | A * | 3/1998 | Pribble | 257/401 |
| 5,874,764 | A * | 2/1999 | Hsieh et al. | 257/401 |
| 5,883,407 | A * | 3/1999 | Kunii et al. | 257/275 |
| 5,990,504 | A * | 11/1999 | Morifuji | 257/270 |
| 6,023,086 | A * | 2/2000 | Reyes et al. | 257/341 |
| 6,090,650 | A * | 7/2000 | Dabral et al. | 438/195 |
| 6,160,280 | A * | 12/2000 | Bonn et al. | 257/272 |
| 6,255,679 | B1 * | 7/2001 | Akiba | 257/284 |
| 6,274,896 | B1 * | 8/2001 | Gibson et al. | 257/259 |
| 6,316,827 | B1 * | 11/2001 | Asano et al. | 257/706 |
| 6,504,209 | B2 * | 1/2003 | Disney | 257/342 |
| 6,541,827 | B1 * | 4/2003 | Takaishi | 257/390 |
| 6,858,504 | B2 * | 2/2005 | Noble | 438/300 |
| 7,135,747 | B2 | 11/2006 | Allen et al. | 257/401 |
| 7,560,756 | B2 * | 7/2009 | Chau et al. | 257/287 |
| 2007/0090414 | A1 * | 4/2007 | Sutou et al. | 257/277 |

(Continued)

FOREIGN PATENT DOCUMENTS

EP 0 725 445 A1 8/1996

(Continued)

*Primary Examiner*—Chris Chu
(74) *Attorney, Agent, or Firm*—Oblon, Spivak, McClelland, Maier & Neustadt, L.L.P.

(57) ABSTRACT

Electrode placement which applies easy heat dispersion of a semiconductor device with high power density and high exothermic density is provided for the semiconductor device including: a gate electrode, a source electrode, and a drain electrode which are placed on a first surface of a substrate 10, and have a plurality of fingers, respectively; gate terminal electrodes G1, G2, ..., G4, source terminal electrodes S1, S2, ..., S5, and a drain terminal electrode D which are placed on the first surface, and governs a plurality of fingers, respectively every the gate electrode, the source electrode, and the drain electrode; active areas AA1, AA2, ..., AA5 placed on the substrate of the lower part of the gate electrode, the source electrode, and the drain electrode; a non-active area (BA) adjoining the active areas and placed on the substrate; and VIA holes SC1, SC2, ..., SC5 connected to the source terminal electrodes, wherein the active areas are divided into a plurality of stripe shapes, and the fishbone placement of the gate electrode is performed.

20 Claims, 12 Drawing Sheets

U.S. PATENT DOCUMENTS

2009/0108357 A1 * 4/2009 Takagi ........................ 257/365

FOREIGN PATENT DOCUMENTS

| | | |
|---|---|---|
| EP | 0 936 669 A1 | 8/1999 |
| JP | 57-160148 | 10/1982 |
| JP | 2-288409 | 11/1990 |
| JP | 5-251478 | 9/1993 |
| JP | 6-140437 | 5/1994 |
| JP | 8-213409 | 8/1996 |
| JP | 8-250671 | 9/1996 |
| JP | 10-144913 | 5/1998 |
| JP | 2001-15526 | 1/2001 |
| JP | 2001-28425 | 1/2001 |
| JP | 2007-243018 | 9/2007 |

* cited by examiner

SEMICONDUCTOR DEVICE

CROSS REFERENCE TO RELATED APPLICATION AND INCORPORATION BY REFERENCE

This application is based upon and claims the benefit of priority from prior Japanese Patent Application No. P2007-278970 filed on Oct. 26, 2007, the entire contents of which are incorporated herein by reference.

BACKGROUND OF THE INVENTION

1. Field of the Invention

The present invention relates to a semiconductor device, and in particular, relates to a semiconductor device which has the characteristic in electrode placement which makes easy heat dispersion of a power amplification element with high exothermic densities, such as GaN based Field Effect Transistors (FETs).

2. Description of the Related Art

A semiconductor device used with a high frequency band, for example, a microwave power amplifying device, is composed of active elements, such as FETs, passive elements, such as resistance and a capacitor, and circuit elements, such as microstrip lines for transmitting a high frequency signal. These circuit elements are formed, for example on a semi-insulating substrate. An electrode for grounding is formed on a backside of the semi-insulating substrate. And, when grounding the circuit element, the electrode for grounding formed on the backside of the semi-insulating substrate provided on the semi-insulating substrate is electrically connected with the circuit element through a VIA hole (via hole) which passes through the semi-insulating substrate, for example (for example, refer to Patent Document 1 and Patent Documents 2). Technology of others shown in Patent Documents 3 to 5 is disclosed.

As a shown in FIG. 1, for example, in a semiconductor device according to a conventional example, a gate electrode 24, a source electrode 20 and a drain electrode 22 have a plurality of fingers, and the plurality of fingers are governed every gate electrode 24, source electrode 20 and drain electrode 22 to form an electrode for terminals, on a substrate 10. As shown in FIG. 1, a part on which the gate electrode 24, the source electrode 20, and the drain electrode 22 have a plurality of finger shape forms an active area AA, and forms an exothermic part.

In an example of FIG. 1, gate terminal electrodes G1, G2, . . . , G4 and source terminal electrodes S1, S2, . . . , S5 are placed at the end of one side, and a drain terminal electrode D is placed at the end of another side.

Near the surface of the substrate 10, the active area AA is formed on the substrate 10 of the lower part of the gate electrode 24, the source electrode 20, and the drain electrode 22.

In the example of FIG. 1, in the source terminal electrodes S1 S2, . . . , S5, near the active area AA, VIA holes SC1, SC2, . . . , SC5 are formed from a backside of the substrate 10, and a ground conductor is formed on the backside of the substrate 10. And, when grounding the circuit element, the circuit element provided on the substrate 10 and the ground conductor formed on the backside of the substrate 10 are electrically connected through the VIA holes SC1, SC2, . . . , SC5 which pass through the substrate 10.

In addition, the gate terminal electrodes G1, G2, . . . , G4 are connected to a surrounding circuit elements by a bonding wire etc., and the drain terminal electrode D is also connected to a surrounding circuit elements chip by a bonding wire etc.

As mentioned above, since a plurality of fingers of the gate electrode 24, the source electrode 20, and the drain electrode 22 are placed on one continuous active area in the conventional semiconductor device, it is difficult to distribute heat sources generated in the active areas AA. The operational performance of a power amplification element with high exothermic density, such as GaN based FETs, was deteriorated in particular remarkably.

For example, it is possible by extending electrode spacing between the source electrode 20 and the gate electrode 24, between the drain electrode 22 and the gate electrode 24, etc. to distribute the heat source generated in the active area AA to some extent. However, the effect becomes small by a reciprocal of a distance of the electrode spacing.

That is, in order to set up the same current capacity by using a configuration which extends the electrode spacing, since finger length becomes long, parasitic capacitance increases. Moreover, since finger length of a gate becomes long at about 2 times by using a configuration which extends the electrode spacing, a conductor loss of the gate electrode finger itself becomes large. Moreover, since finger of the gate electrode 24 and the drain electrode 22 becomes long at about 2 times by using the configuration which extends the electrode spacing, a conductor loss of gate electrode finger and the drain electrode finger itself becomes large.

Patent Document 1:

Japanese Patent Application Laying-Open Publication No. H02-288409

Patent Document 2:

Japanese Patent Application Laying-Open Publication No. 2001-28425

Patent Document 3:

Japanese Patent Application Laying-Open Publication No. S57-160148

Patent Document 4:

Japanese Patent Application Laying-Open Publication No. H08-213409

Patent Document 5:

U.S. Pat. No. 7,135,747

SUMMARY OF THE INVENTION

According to an aspect of the invention, a semiconductor device comprises: a substrate; a gate electrode, a source electrode, and a drain electrode which are placed on a first surface of the substrate, and have a plurality of fingers, respectively; a gate terminal electrode, a source terminal electrode, and a drain terminal electrode which are placed on the first surface of the substrate, and governs and forms a plurality of fingers, respectively for every the gate electrode, the source electrode, and the drain electrode; an active area placed on the substrate of the lower part of the gate electrode, the source electrode, and the drain electrode; a non-active area adjoining the active area and placed on the substrate of the lower part of the gate electrode, the source electrode, and the drain electrode; and a via hole connected to the source terminal electrode. The active area is divided into a plurality of stripe shapes, and the gate electrodes are formed as fishbone placement, and a bus line of the concerned fishbone placement is placed on the non-active areas of stripe shape.

In the semiconductor device, the drain electrode is also formed as fishbone placement.

By dividing the active area into stripe shapes, heat sources are distributed and are also placed in the direction which intersects perpendicularly with electrodes as well as electrode spacing.

Moreover, in the semiconductor device, a part on the non-active areas of stripe shape of the source electrode or the drain electrode has air bridge structure.

By applying the electrode on the non-active areas into structure of an air bridge, parasitic capacitance is reduced by an air gap (air layer) being made between the substrate and the air bridge.

Moreover, in the semiconductor device, a part of the source electrode on the active areas of stripe shape of the gate electrode and the drain electrode has air bridge structure.

By applying the part of the source electrode on the active areas of stripe shape of the gate electrode and the drain electrode into structure of an air bridge, parasitic capacitance is reduced by an air gap (air layer) being made between the substrate and the air bridge.

Moreover, in the semiconductor device, the gate electrode connects the gate electrode in the shape of a fishbone from a wide supply line.

Moreover, in the semiconductor device, the drain electrode connects the drain electrode in the shape of a fishbone from a wide supply line.

Conductor loss is reduced by half by connecting the gate electrode and the drain electrode in the shape of the fishbone from the wide supply line.

Moreover, in the semiconductor device, the substrate is a SiC substrate, a GaN substrate, a substrate in which a GaN epitaxial layer is formed on a SiC substrate, a substrate in which a heterojunction epitaxial layer composed of GaN/AlGaN is formed on a SiC substrate, a sapphire substrate, or a diamond substrate.

Moreover, in the semiconductor device, the substrate is a semiconductor substrate, which has conductivity on a surface layer, and the non-active areas are formed by ion implantation.

Moreover, in the semiconductor device, the substrate is a semiconductor substrate, which has conductivity on a surface layer, and the non-active areas are formed by mesa etching.

Moreover, in the semiconductor device, the substrate is a semi-insulating semiconductor substrate, and the active areas are formed by one of ion implantation and diffusion.

Moreover, in the semiconductor device, the substrate is a semi-insulating semiconductor substrate, the active areas are formed by one of ion implantation and diffusion, and the non-active areas are formed by ion implantation.

According to the present invention, a semiconductor device, which improves efficiency of heat dissipation, can be provided.

Moreover, according to the present invention, electrode placement, which applies easy heat dispersion of a semiconductor device with high power density and high exothermic density, can be provided.

Moreover, according to the present invention, electrode placement, which applies easy heat dispersion of a power amplification element with high exothermic densities, such as GaN based FETs, can be provided.

DETAILED DESCRIPTION OF THE EMBODIMENTS

Figure 1:
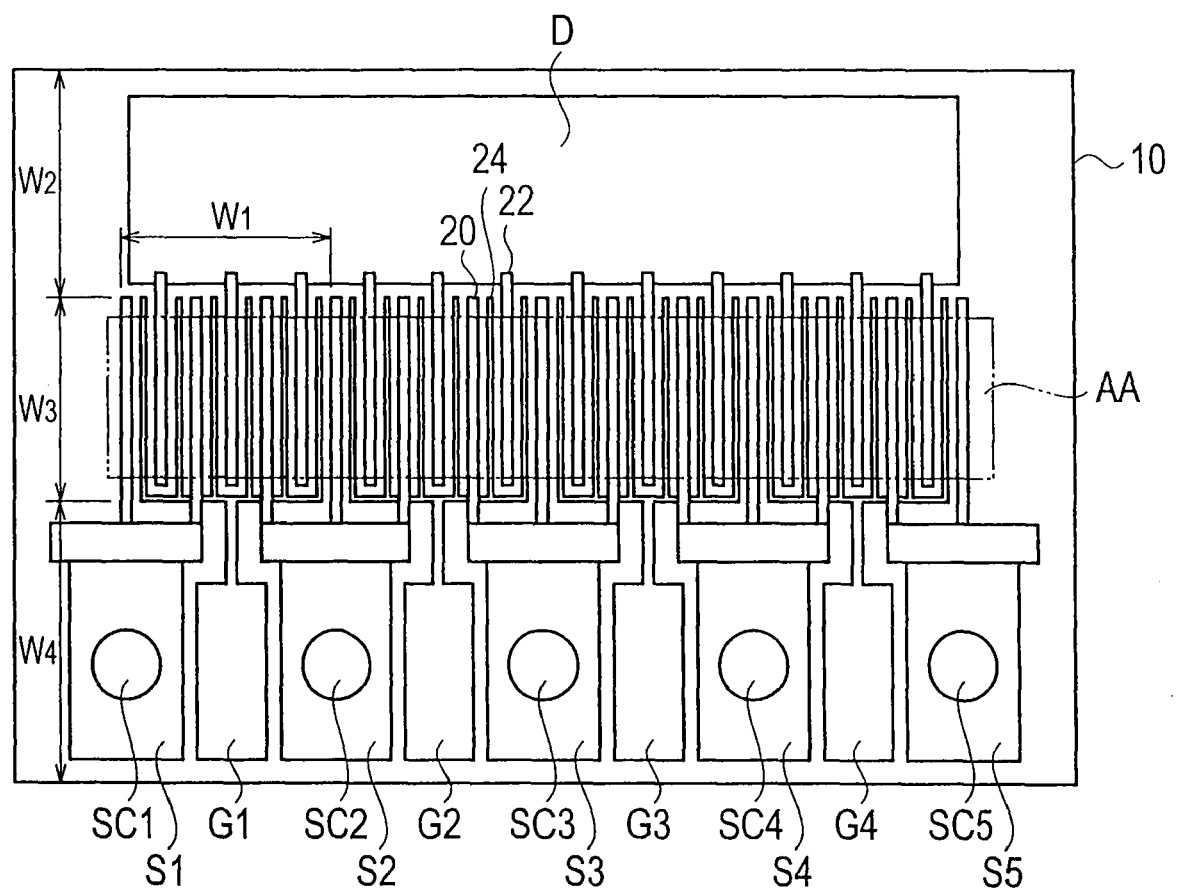
FIG. 1 is a schematic plane pattern configuration diagram showing a semiconductor device according to a conventional example.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings. In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order to not obscure the present invention with unnecessary detail.

The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

COMPARATIVE EXAMPLE

Comparative Example 1

Figure 4:
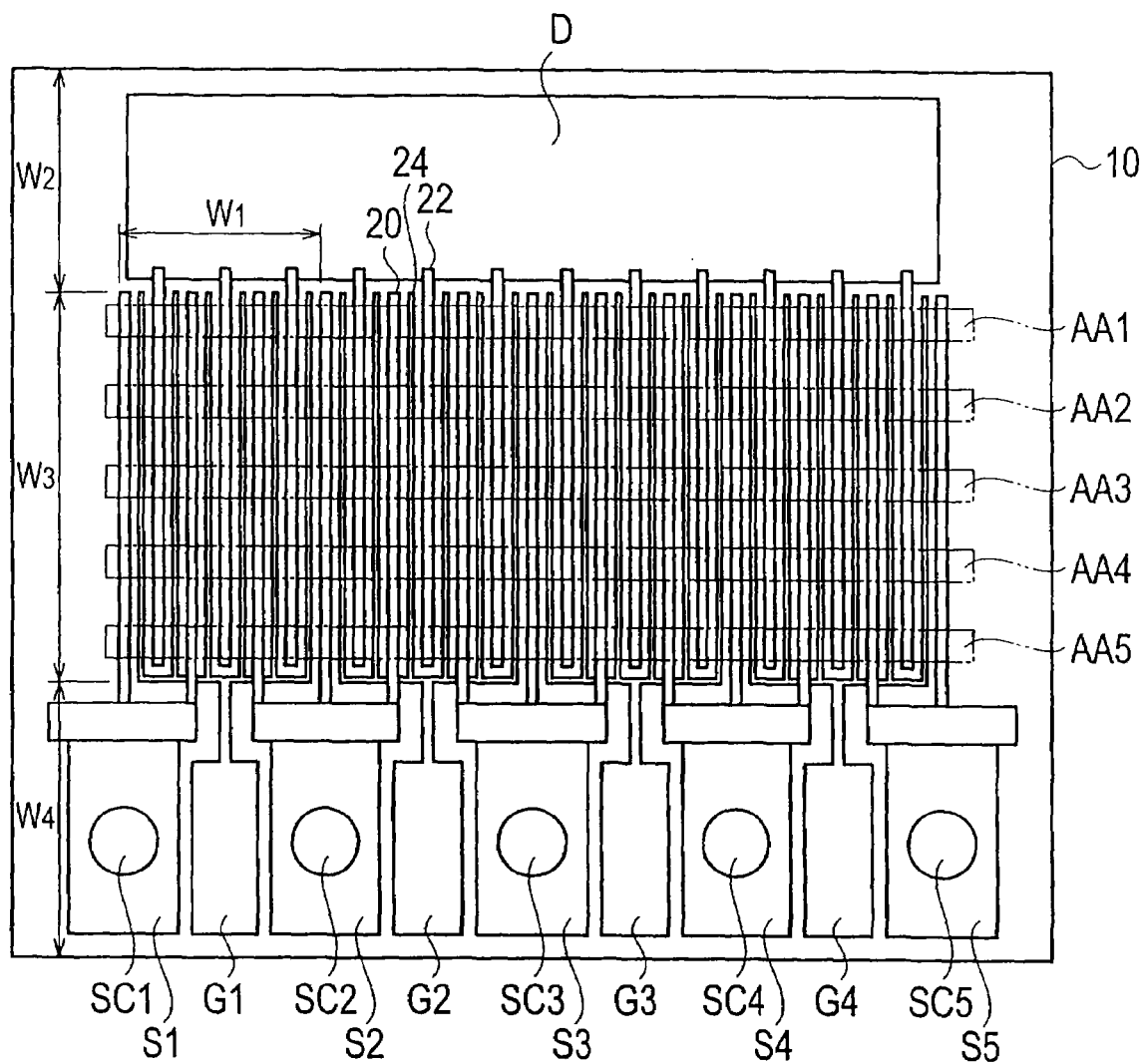
FIG. 4 is a schematic plane pattern configuration diagram showing a semiconductor device according to a comparative example 1 of the present invention.

A schematic plane pattern configuration of a semiconductor device according to a comparative example 1 of the present invention is expressed as shown in FIG. 4.

As shown in FIG. 4, the semiconductor device according to the comparative example 1 of the present invention includes: a substrate 10; a gate electrode 24, a source electrode 20, and a drain electrode 22 which are placed on a first surface of the substrate 10 and have a plurality of fingers, respectively; gate terminal electrodes G1, G2, . . . , G4, source terminal electrodes S1, S2, . . . , S5, and a drain terminal electrode D which are placed on the first surface of the substrate 10, and governs and forms a plurality of fingers, respectively, every the gate electrode 24, the source electrode 20, and the drain electrode 22; active areas $AA_1$, $AA_2$, . . . , $AA_5$ placed on the substrate 10 of the lower part of the gate electrode 24, the source electrode 20, and the drain electrode 22; a non-active area BA (not showing: refer to below-mentioned FIG. 11) adjoining of the active areas $AA_1$, $AA_2$, . . . , $AA_5$ and placed on the substrate 10 of the lower part of the gate electrode 24, the source electrode 20, and the drain electrode 22; and VIA holes SC1, SC2, . . . , SC5 connected to the source terminal electrodes S1, S2, . . . S5. Furthermore, the active areas $AA_1$, $AA_2$, . . . , $AA_5$ are divided and placed with a plurality of stripe shapes.

In the configuration example of FIG. 4, as for the size of each part, for example, cell width W1 is about 120 micrometers, W2 is about 80 micrometers, cell length W3 is about 200 micrometers, W4 is about 120 micrometers, and gate width WG is about 4.8 mm (=200 micrometer×6×4 cells) as a whole.

Comparative Example 2

Figure 5:
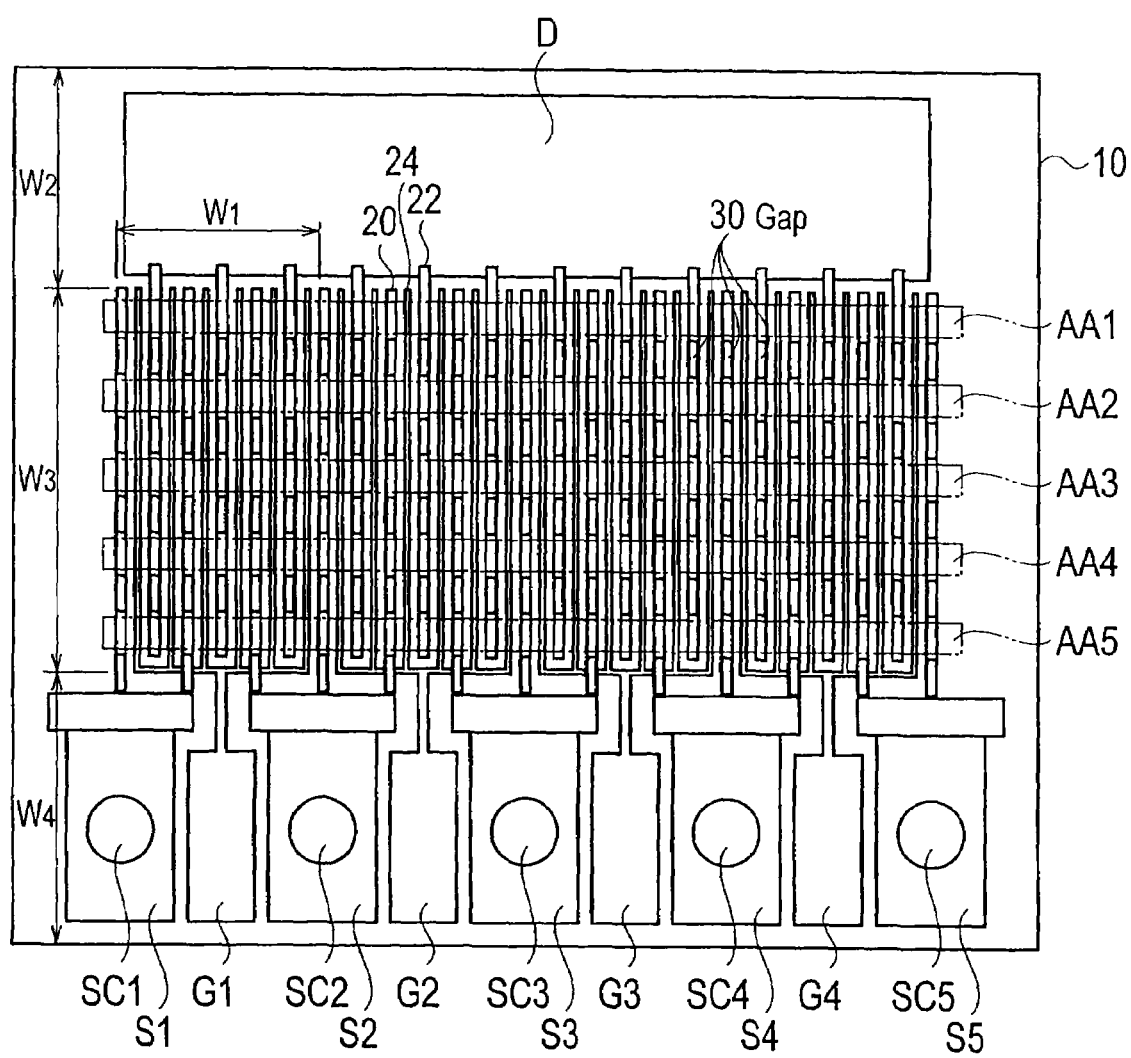
FIG. 5 is a schematic plane pattern configuration diagram showing a semiconductor device according to a comparative example 2 of the present invention.

Moreover, a schematic plane pattern configuration of a semiconductor device according to a comparative example 2 of the present invention is expressed as shown in FIG. 5.

As shown in FIG. 5, the semiconductor device according to the comparative example 1 of the present invention includes: a substrate 10; a gate electrode 24, a source electrode 20, and a drain electrode 22 which are placed on a first surface of the substrate 10, and have a plurality of fingers, respectively; gate terminal electrodes G1, G2, . . . , G4 and the source terminal electrodes S1, S2, . . . , S5, and the drain terminal electrode D which are placed on the first surface of the substrate 10, governs and forms a plurality of fingers, respectively, every the gate electrode 24, the source electrode 20, and the drain electrode 22; active areas $AA_1$, $AA_2$, . . . , $AA_5$ placed on the substrate 10 of the lower part of the gate electrode 24, the source electrode 20, and the drain electrode 22; a non-active area BA (not showing: refer to below-mentioned FIG. 11) adjoining the active areas $AA_1$, $AA_2$, . . . , $AA_5$ and placed on the substrate 10 of the lower part of the gate electrode 24, the source electrode 20, and the drain electrode 22; and VIA holes SC1, SC2, SC5 connected to the source terminal electrodes S1, S2, . . . , S5. Furthermore, the active areas $AA_1$, $AA_2$, . . . , $AA_5$ are divided and placed with a plurality of stripe shapes, and also a part on the non-active area BA of stripe shape of the source electrode 20 and the drain electrode 22 has structure of an air bridge 30.

In the configuration example of FIG. 5, as for the size of each part, for example, cell width W1 is about 120 micrometers, W2 is about 80 micrometers, cell length W3 is about 400 micrometers, W4 is about 120 micrometers, and gate width WG is about 4.8 mm (=40 micrometer×5×6×4 cells) as a whole.

By placing the air bridge 30, the cell length W3 becomes twice the comparative example 1.

First Embodiment

Figure 2:
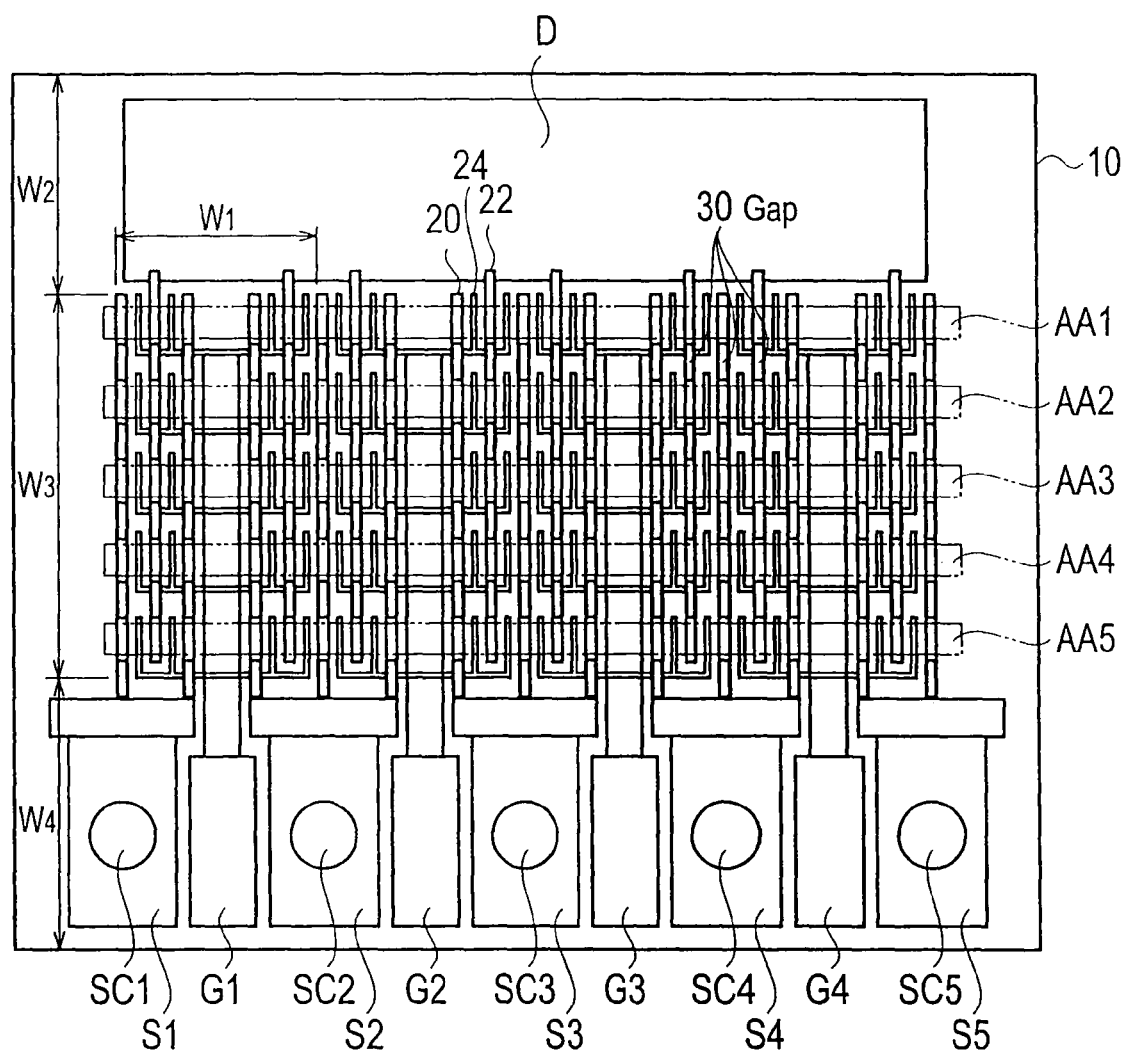
FIG. 2 is a schematic plane pattern configuration diagram showing a semiconductor device according to a first embodiment of the present invention.

A schematic plane pattern configuration of a semiconductor device according to a first embodiment of the present invention is expressed as shown in FIG. 2.

As shown in FIG. 2, the semiconductor device according to the first embodiment of the present invention includes: a substrate 10; a gate electrode 24, a source electrode 20, and a drain electrode 22 which are placed on a first surface of the substrate 10 and have a plurality of fingers, respectively; gate terminal electrodes G1, G2, . . . , G4 and source terminal electrodes S1, S2, . . . , S5, and a drain terminal electrode D which are placed on the first surface of the substrate 10, and governs and forms a plurality of fingers, respectively every the gate electrode 24, the source electrode 20, the and drain electrode 22; active areas $AA_1$, $AA_2$, . . . , $AA_5$ placed on the substrate 10 of the lower part of the gate electrode 24, the source electrode 20, and the drain electrode 22; a non-active area BA (not showing: refer to below-mentioned FIG. 11) adjoining of the active areas $AA_1, AA_2, \ldots, AA_5$, and placed on the substrate 10 of the lower part of the gate electrode 24, the source electrode 20, and the drain electrode 22; and VIA holes $SC1, SC2, \ldots, SC5$ connected to the source terminal electrodes $S1, S2, \ldots, S5$. Furthermore, the active areas $AA_1, AA_2, \ldots, AA_5$ are divided and placed with a plurality of stripe shapes, and the gate electrodes 24 are formed as fishbone placement, and a bus line of the concerned fishbone placement is placed on the non-active areas BA of stripe shape.

According to the semiconductor device according to the first embodiment of the present invention, as shown in FIG. 2, by dividing the active areas $AA_1, AA_2, \ldots, AA_5$ into stripe shapes, heat sources are distributed and are also placed in the direction which intersects perpendicularly with electrodes as well as electrode spacing. For this reason, a power semiconductor device with sufficient efficiency of heat dissipation can be realized.

Moreover, as shown in FIG. 2, a part on the non-active areas BA of stripe shape of the source electrode 20 and the drain electrode 22 has the structure of the air bridge 30.

According to the semiconductor device of the present invention, parasitic capacitance is reduced by an air gap 14 (air layer) being formed between the substrate 10 and the air bridge 30 by applying the source electrode 20 and the drain electrode 22 on the non-active areas BA into the structure of the air bridge 30.

Moreover, as shown in FIG. 2, the gate electrode 24 of the fishbone placement has structure of connecting the gate electrode 24 into the shape of the fishbone from a wide supply line.

As shown in FIG. 2, phase shifts accompanying transfer of a gate input signal from the gate terminal electrodes G1, G2, ..., G4 to each unit of the semiconductor device part can be alleviated by applying the gate electrode 24 into the shape of the fishbone from the wide supply line.

Moreover, the conductor loss of the gate electrode 24 is reduced by half by placing the gate electrode 24 into the shape of the fishbone placement from the wide supply line.

In the configuration example of FIG. 2, as for the size of each part, for example, cell width W1 is about 120 micrometers, W2 is about 80 micrometers, cell length W3 is about 400 micrometers, W4 is about 120 micrometers, and gate width WG is about 3.2 mm (=40 micrometer×5×6×4 cells) as a whole.

The substrate may be a SiC substrate, a GaN substrate, a substrate on which a GaN epitaxial layer is formed on a SiC substrate, a substrate on which a heterojunction epitaxial layer composed of GaN/AlGaN is formed on a SiC substrate, a sapphire substrate, or a diamond substrate, for example.

(Air Bridge Structure)

Figure 10:
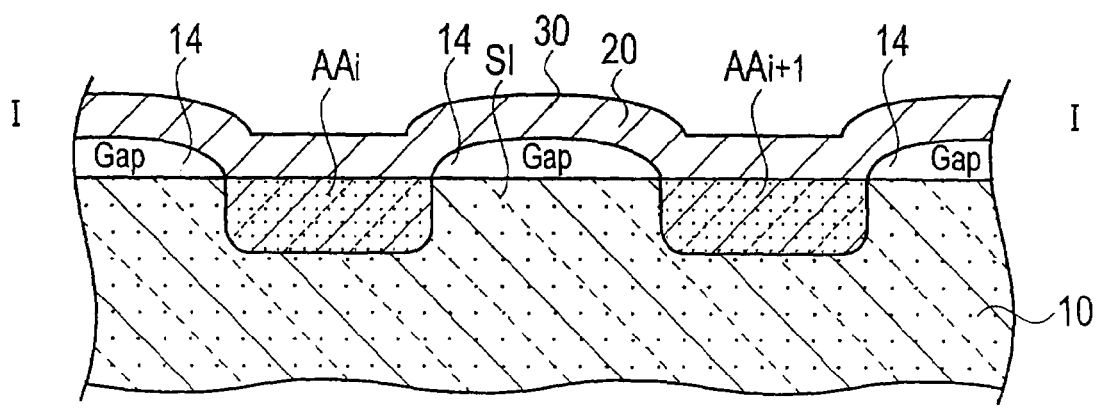
FIG. 10 is a schematic section structure chart of a semiconductor device, which forms the source electrode 20 directly on the active areas $AA_i$ and $AA_{i+1}$, and forms an air gap 14 by structure of a air bridge 30 on the semi-insulating substrate 10, in the semiconductor devices according to the first to second embodiment of the present invention.

In the semiconductor device according to the first embodiment of the present invention, a schematic section structure of the semiconductor device which forms the source electrode 20 directly on the active areas $AA_i, AA_{i+1}, \ldots$, and forms the air gap 14 by structure of the air bridge 30 on the semi-insulating substrate 10 is expressed as shown in FIG. 10.

Figure 11:
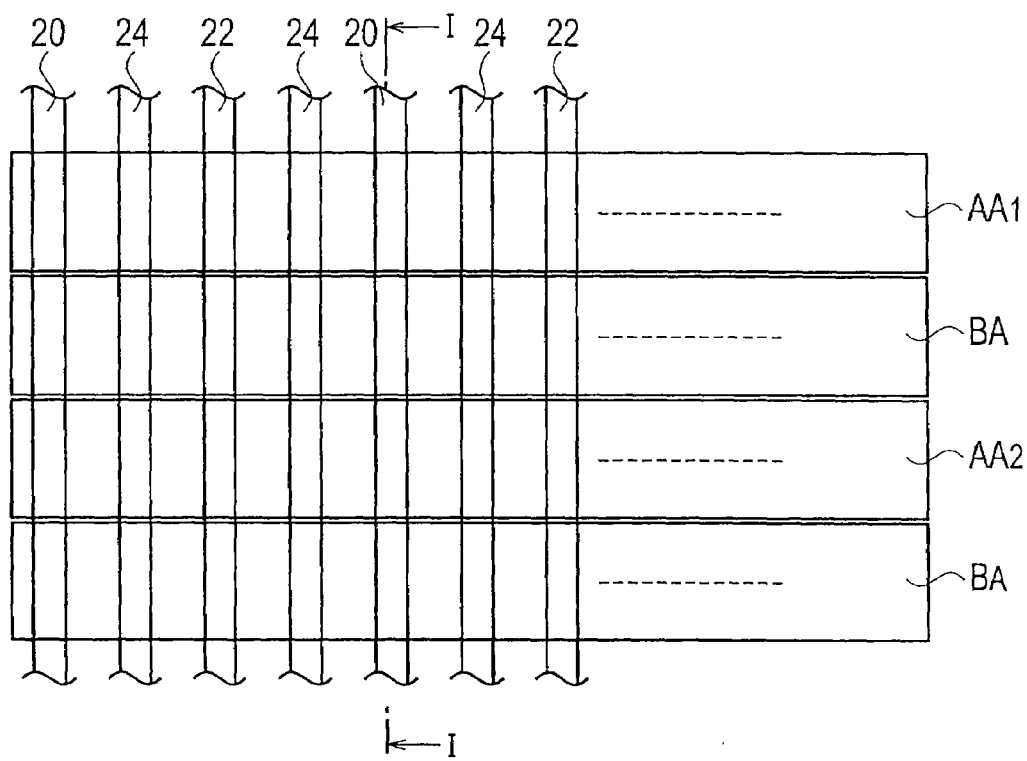
FIG. 11 is a schematic plane pattern configuration diagram showing a semiconductor device which forms the source electrode 20, the gate electrode 24 and the drain electrode 22, on the active areas $AA_1, AA_2, \ldots$ and non-active areas BA, in the semiconductor devices according to the first to second embodiment of the present invention.
Figure 18:
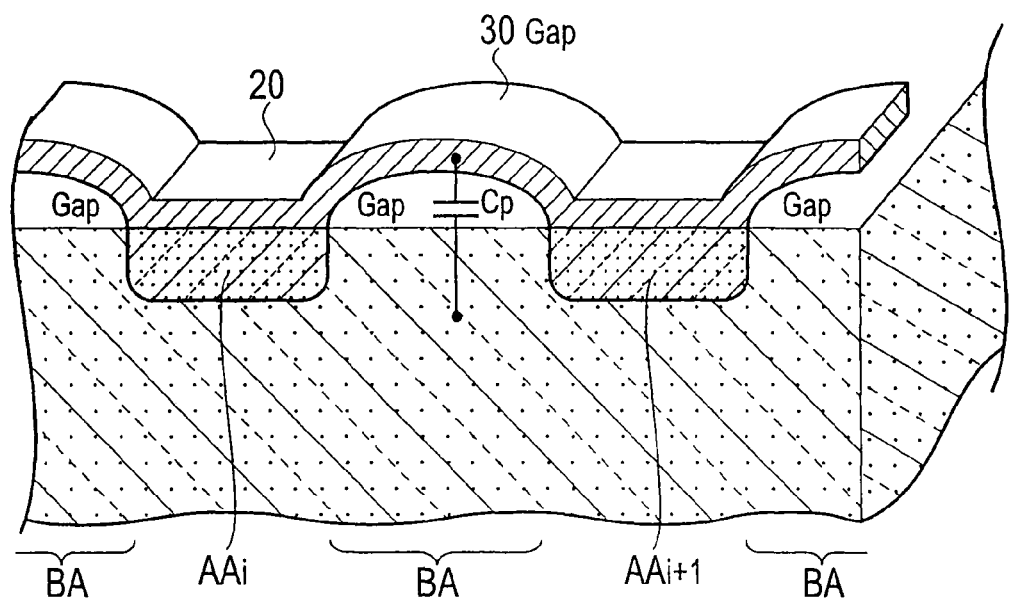
FIG. 18 is a schematic bird's-eye view for explaining an example which forms the active areas $AA_i$, $AA_{i+1}$, . . . by an ion implantation, and forms the non-active areas BA by using the air gap 14 which has the structure of the air bridge 30, in the semiconductor devices according to the first to second embodiment of the present invention.

FIG. 10 corresponds to a section structure taken in the line I-I of a plane pattern configuration diagram of FIG. 11. The air bridge 30 shown in FIG. 2 is formed on a part on the non-active areas BA, for example, as shown in FIG. 10. Moreover, FIG. 18 shows a schematic bird's-eye view corresponding to FIG. 10. Parasitic capacitance Cp of the source electrode 20 of the structure part of the air bridge 30 can be reduced, and the value of the capacitance between the source electrode 20 and the substrate 10 is reduced as a whole, by the air gap 14.

(Plane Pattern Configuration)

In the semiconductor device according to the first embodiment of the present invention, a schematic plane pattern configuration of the semiconductor device on which the source electrode 20, the gate electrode 24, and the drain electrode 22 are formed on the active areas $AA_1, AA_2, \ldots$, and the non-active areas BA is expressed as shown in FIG. 11.

In FIG. 2, the non-active areas BA are placed in the shape of stripe between the active areas $AA_1, AA_2, \ldots$ of stripe shape as shown in FIG. 11.

Figure 12:
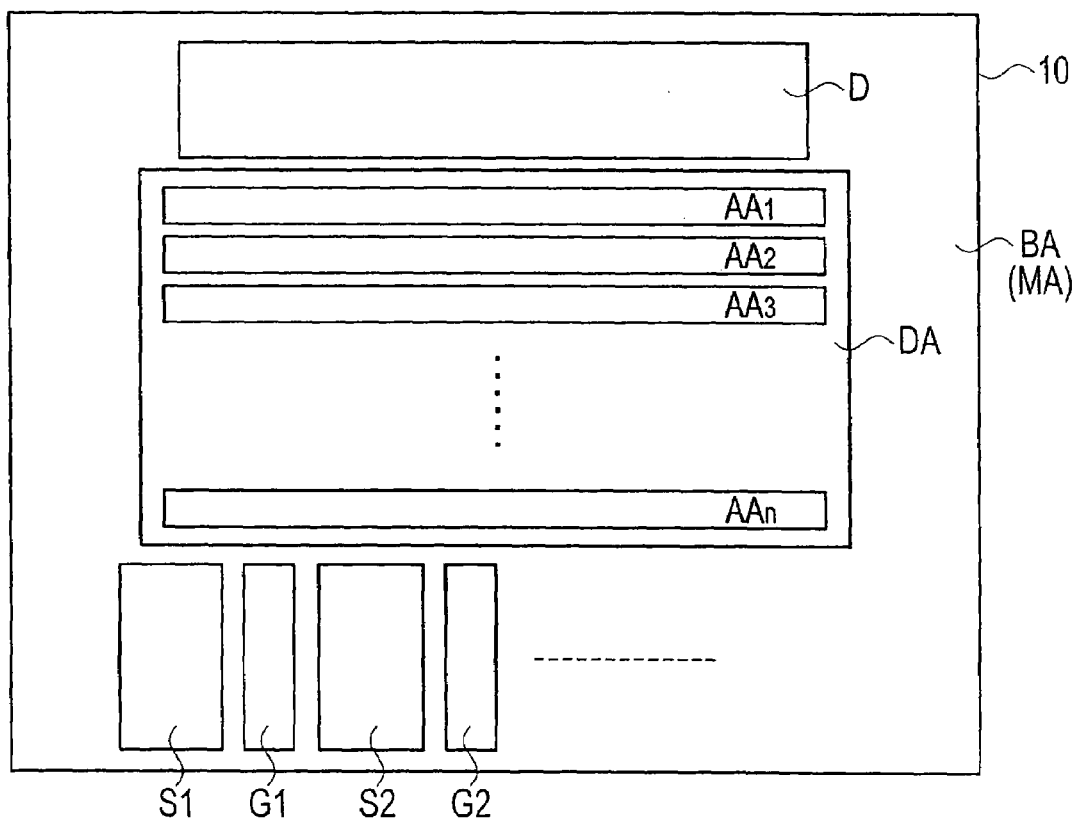
FIG. 12 is a schematic plane pattern configuration diagram for explaining a placement of a device area DA, a drain terminal electrode D, source terminal electrodes S1, S2, ..., drain terminal electrodes D1, D2, ..., and a mesa area MA (non-active area BA), in the semiconductor devices according to the first to second embodiment of the present invention.

FIG. 12 shows a schematic plane pattern chart explaining placement of the device area DA, the drain terminal electrode D, the source terminal electrodes $S1, S2, \ldots$ and a mesa area MA (non-active area BA), in the semiconductor device according to the first embodiment of the present invention. The active areas $AA_1, AA_2, \ldots, AA_n$ are placed in the shape of stripe in the device area DA, and also as shown in FIG. 11, the non-active areas BA are placed between the active areas $AA_1, AA_2, \ldots, AA_n$ of stripe shape. Moreover, in FIG. 12, the non-active areas BA can also be formed as a mesa area.

(Formation Method 1 for Active Area and Non-active Area)

Figure 8:
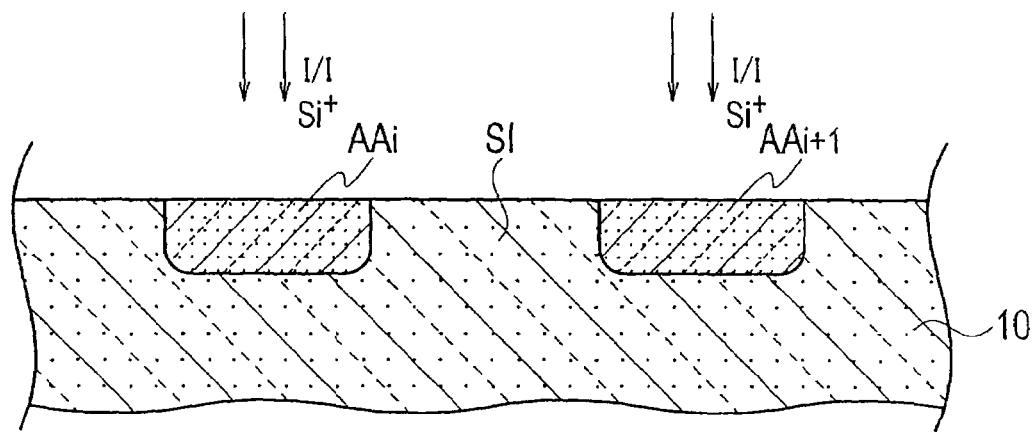
FIG. 8 is a schematic section structure chart for explaining a process of forming active areas $AA_i$ and $AA_{i+1}$ by ion implantation to a semi-insulating substrate 10, in the semiconductor devices according to the first to second embodiment of the present invention.

A schematic section structure for explaining a process of forming the active areas $AA_i$ and $AA_{i+1}$ on the semi-insulating substrate 10 by ion implantation is expressed as shown in FIG. 8, in the semiconductor device according to the first embodiment of the present invention. In FIG. 8, the substrate 10 is a semi-insulating substrate, and the active areas $AA_i$ and $AA_{i+1}$ are formed by the ion implantation of silicon ion ($Si^+$), for example. The non-active area BA can use the semi-insulating substrate 10 from the beginning.

Figure 9:
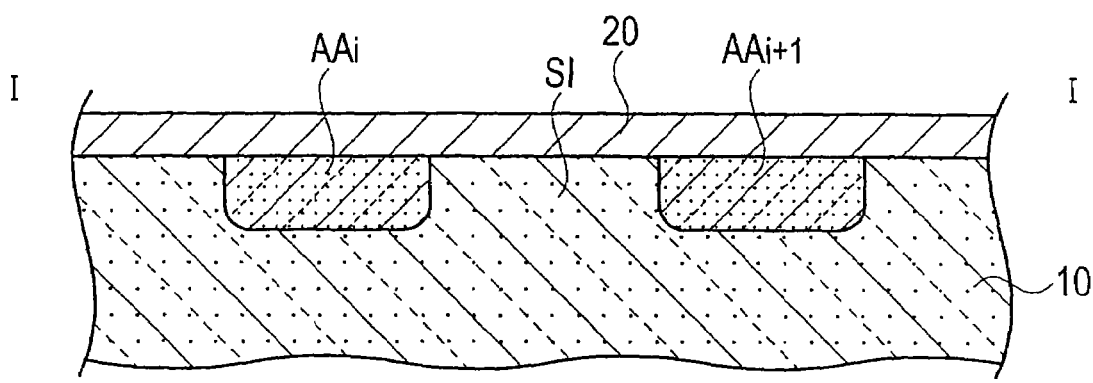
FIG. 9 is a schematic section structure chart showing a semiconductor device, which forms a source electrode 20 directly on the active areas $AA_i$ and $AA_{i+1}$, after a process of FIG. 8.

A schematic section structure of the semiconductor device, which forms the source electrode 20 directly formed on the active areas $AA_i$ and $AA_{i+1}$ after the process of FIG. 8, is expressed as shown in FIG. 9. FIG. 9 corresponds to section structure taken in the line I-I of FIG. 11 mentioned later.

As shown in FIG. 9, in the semiconductor device according to the first embodiment of the present invention, the source electrode 20 is directly electrically connected to the active areas $AA_i, AA_{i+1}, \ldots$, and on the other hand, the source electrode 20 is electrically insulated since the substrate 10 of the non-active area BA being a semi-insulating substrate. In addition, although the source electrode 20 is shown in FIG. 9, even if it is the drain electrode 22, it can be similarly shown instead of being the source electrode 20.

(Formation Method 2 for AA and Non-AA)

Figure 13:
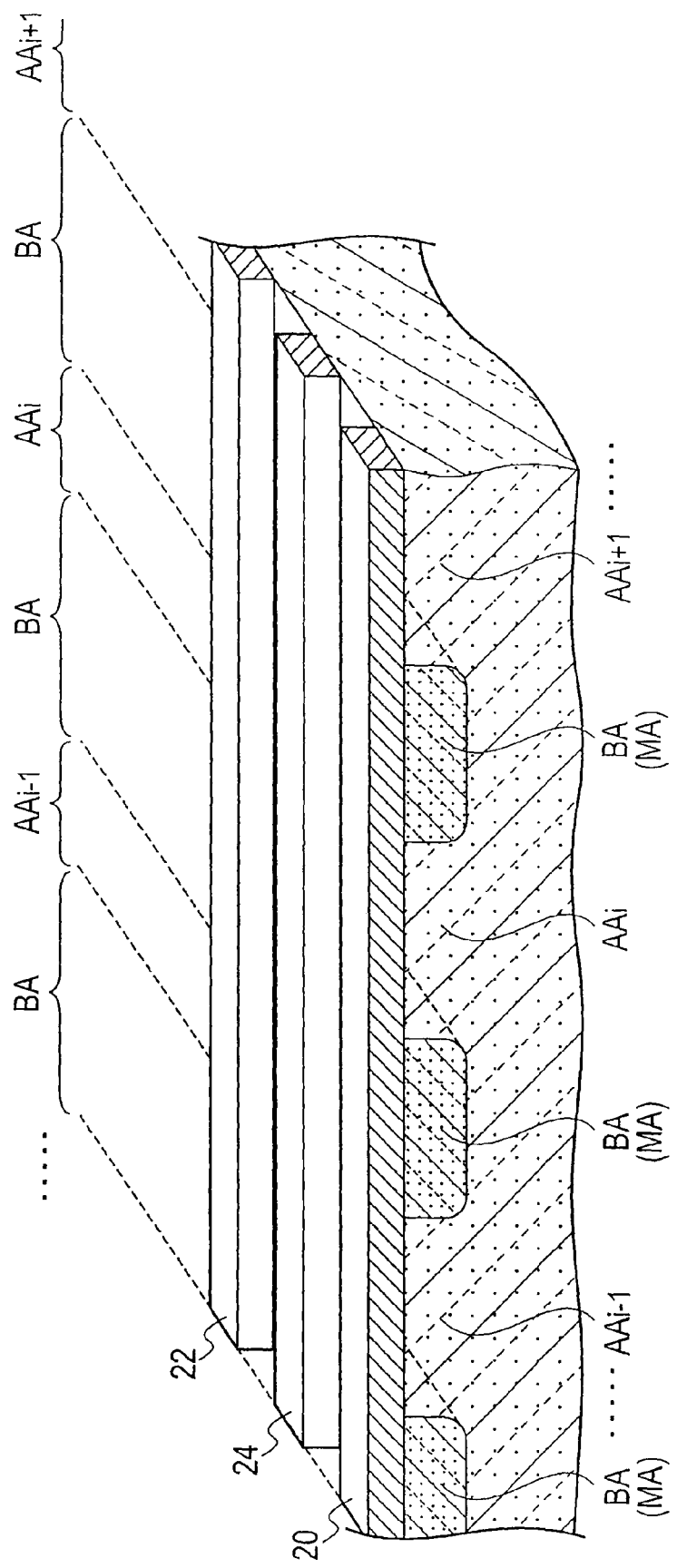
FIG. 13 is a schematic bird's-eye view for explaining an example which forms the active areas $\ldots AA_{i-1}, AA_i,$ and $AA_{i+1} \ldots$ by using the semiconductor substrate, and forms the non-active areas BA by an ion implantation, in the semiconductor devices according to the first to second embodiment of the present invention.

A schematic bird's-eye view for explaining an example which forms the active areas $AA_{i-1}, AA_i, AA_{i+1}, \ldots$ by using the semiconductor substrate 10, and forms the non-active areas BA by ion implantation is expressed as shown in FIG. 13, in the semiconductor device according to the first embodiment of the present invention. As ionic species used at the time of formation of the non-active areas BA, a nitrogen ion etc. are applicable, for example. Or, it is also possible to form the non-active areas BA by collapsing a crystal by ion implantation using ionic species of heavy ion etc. Or moreover, a plan part of the non-active areas BA can be beforehand formed by mesa etching process etc., and then the non-active areas BA can also be formed by being filled up with an insulator.

(Formation Method 3 for AA and Non-AA)

Figure 14:
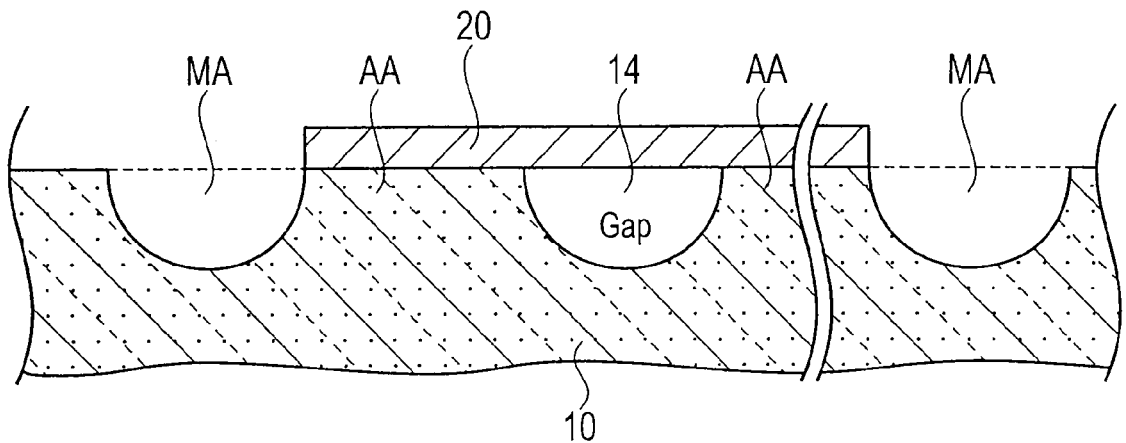
FIG. 14 is a schematic section structure chart for explaining an example which has the air gap 14 forming the non-active areas BA in the device area DA by using a mesa area MA, and forms a periphery of the semiconductor device by using the mesa area MA, in the semiconductor devices according to the first to second embodiment of the present invention.

A schematic section structure for explaining an example which has the air gap 14 forming the non-active areas BA in the device area DA by using a mesa area MA, and forms a periphery of the semiconductor device by using the mesa area MA, is expressed as shown in FIG. 14, in the semiconductor device according to the first embodiment of the present invention. According to the formation method of FIG. 14, a surrounding isolation region and the non-active areas BA in the device area DA can be simultaneously formed by the mesa area MA.

(Formation Method 4 for AA and Non-AA)

Figure 15:
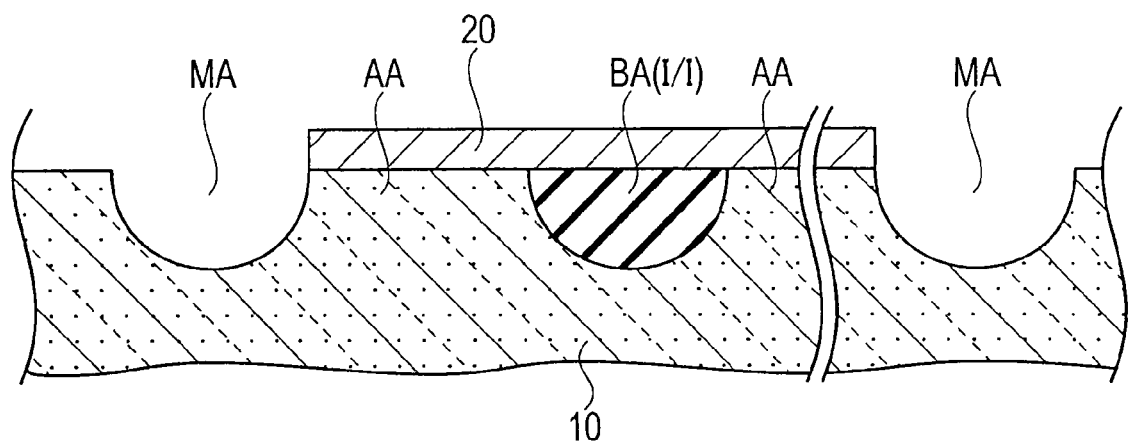
FIG. 15 is a schematic section structure chart for explaining an example, which forms a periphery of the semiconductor device by using the mesa area MA, and forms the non-active area BA in the device area DA by an ion implantation, in the semiconductor devices according to the first to second embodiment of the present invention.

A schematic section structure for explaining an example which forms a periphery of the semiconductor device by using mesa area MA, and forms the non-active area BA in the device area DA by the ion implantation is expressed as shown in FIG. 15, in the semiconductor device according to the first embodiment of the present invention. When forming the non-active area BA in the device area DA by the ion implantation, as the ionic species to be used, a nitrogen ion etc. can be applied, for example. Or, it is also possible to form the non-active areas BA by collapsing a crystal by the ion implantation by using ionic species of heavy ion etc.

(Formation Method 5 for AA and Non-AA)

Figure 16:
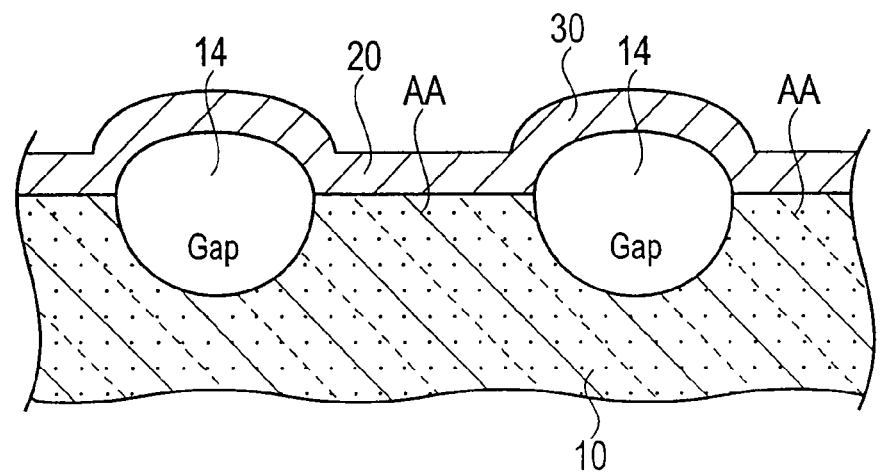
FIG. 16 is a schematic section structure chart for explaining an example which forms the active area AA by using the semiconductor substrate, and forms the non-active area BA by using the air gap 14 which has the structure of the air bridge 30, in the semiconductor devices according to the first to second embodiment of the present invention.

A schematic section structure for explaining an example which forms the active areas AA by using the semiconductor substrate 10, and forms non-active areas BA by using the air gaps 14 which has the structure of the air bridge 30 is expressed as shown in FIG. 16, in the semiconductor device according to the first embodiment of the present invention. A relationship between the active areas AA and the non-active areas BA of the structure shown in FIG. 10 and FIG. 18 is reverse from the relationship between the active areas AA and the non-active areas BA of the structure shown in FIG. 16.

(Formation Method 6 for AA and Non-AA)

Figure 17:
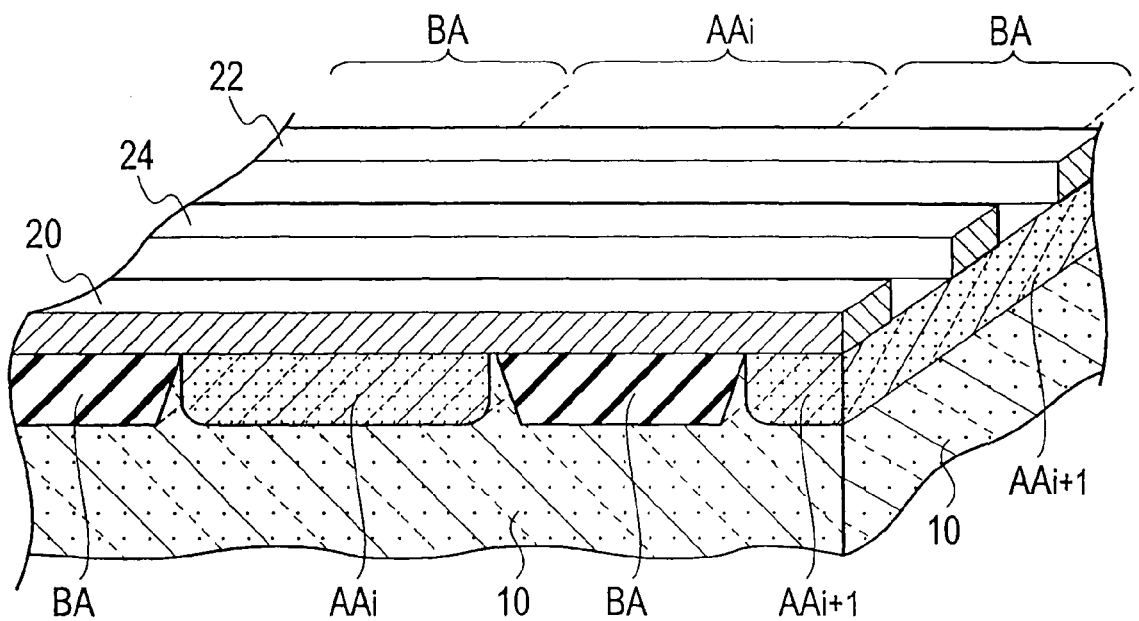
FIG. 17 is a schematic bird's-eye view for explaining an example which forms both of the active areas . . . $AA_i$, $AA_{i+1}$, . . . and the non-active areas BA in the device area DA by an ion implantation, in the semiconductor devices according to the first to second embodiment of the present invention.

A schematic bird's-eye view for explaining an example which forms both of the active areas $AA_i$, $AA_{i+1}$, ... and the non-active areas BA by ion implantation in the device area DA is expressed as shown in FIG. 17, in the semiconductor device according to the first embodiment of the present invention.

In FIG. 17, the substrate 10 is a semi-insulating substrate and the active areas $AA_i$ and $AA_{i+1}$ are formed by the ion implantation of silicon ion ($Si^+$), for example. As the ionic species used at the time of formation of the non-active areas BA, a nitrogen ion etc. are applicable, for example. Or, it is also possible to form the non-active areas BA by collapsing a crystal by the ion implantation by using ionic species of heavy ion etc.

As shown in FIG. 17, in the semiconductor device according to the first embodiment of the present invention, the source electrode 20, the drain electrode 22, and the gate electrode 24 are directly electrically connected to the active areas $AA_i$, $AA_{i+1}$, ..., and on the other hand, the source electrode 20, the drain electrode 22, and the gate electrode 24 are electrically insulated with the non-active areas BA.

Modified Example of First Embodiment

Figure 3:
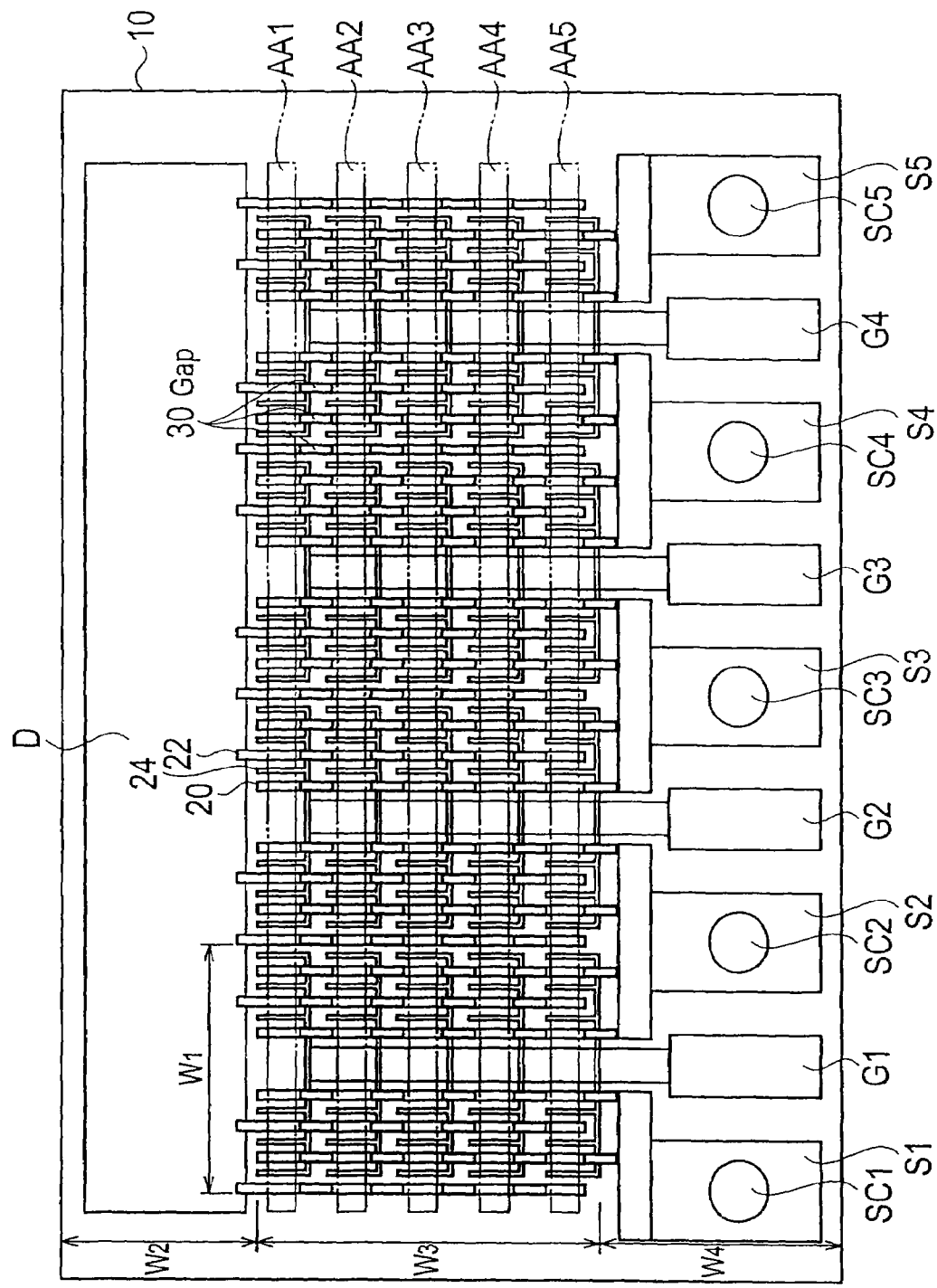
FIG. 3 is a schematic plane pattern configuration diagram showing a semiconductor device according to a modified example of the first embodiment of the present invention.

A schematic plane pattern configuration of a semiconductor device according to a modified example of the first embodiment of the present invention is expressed as shown in FIG. 3.

As shown in FIG. 3, the semiconductor device according to the modified example of the first embodiment of the present invention includes: a substrate 10; a gate electrode 24, a source electrode 20, and a drain electrode 22 which are placed on a first surface of the substrate 10 and have a plurality of fingers, respectively; gate terminal electrodes G1, G2, ..., G4, source terminal electrodes S1, S2, ..., S5, and the drain terminal electrode D which are placed on the first surface of the substrate 10, and governs and forms a plurality of fingers, respectively every the gate electrode 24, the source electrode 20, and drain electrode 22; active areas $AA_1$, $AA_2$, ..., $AA_5$ placed on the substrate 10 of the lower part of the gate electrode 24, the source electrode 20, and the drain electrode 22; a non-active areas BA (not showing: refer to FIG. 11) adjoining the active areas $AA_1$, $AA_2$, ..., of $AA_5$, and placed on the substrate 10 of the lower part of the gate electrode 24, the source electrode 20, and the drain electrode 22; and VIA holes SC1, SC2, ..., SC5 connected to the source terminal electrodes S1, S2, ..., S5. Furthermore, the active areas $AA_1$, $AA_2$, ..., $AA_5$ are divided and placed with a plurality of stripe shapes, and the gate electrodes 24 are formed by fishbone placement, and a bus line of the concerned fishbone placement is placed on the non-active area BA of stripe shape.

According to the semiconductor device according to the modified example of the first embodiment of the present invention, as shown in FIG. 3, by dividing the active areas $AA_1$, $AA_2$, ..., $AA_5$ into stripe shape, heat sources are distributed and are also placed in the direction which intersects perpendicularly with electrodes as well as electrode spacing. For this reason, a power semiconductor device with sufficient efficiency of heat dissipation can be realized.

Moreover, as shown in FIG. 3, a part on the non-active areas BA of stripe shape of the source electrode 20 and the drain electrode 22 has the structure of the air bridge 30.

According to the semiconductor device according to the modified example of the first embodiment of the present invention, parasitic capacitance is reduced by an air gap 14 (air layer) being formed between the substrate 10 and the air bridge 30 by applying the source electrode 20 and the drain electrode 22 on the non-active areas BA into the structure of the air bridge 30.

Moreover, as shown in FIG. 3, the gate electrode 24 of the fishbone placement has structure of connecting the gate electrode 24 into the shape of the fishbone from a wide supply line.

As shown in FIG. 3, phase shifts accompanying transfer of a gate input signal from the gate terminal electrodes G1, G2, ..., G4 to each unit of the semiconductor device part can be alleviated by applying the gate electrode 24 into the shape of the fishbone from the wide supply line.

Moreover, the conductor loss of the gate electrode 24 is reduced by half by placing the gate electrode 24 into the shape of the fishbone placement from the wide supply line.

In the configuration example of FIG. 3, as for the size of each part, for example, cell width W1 is about 170 micrometers, W2 is about 80 micrometers, cell length W3 is about 400 micrometers, W4 is about 120 micrometers, and gate width WG is about 4.8 mm (=40 micrometer×5×6×4 cells) as a whole.

According to the semiconductor device according to the modified example of the first embodiment of the present invention, it is realized to extend the value of the gate width WG by the fishbone placement of the gate electrodes 24, while the value of the gate width WG is reduced in the semiconductor device according to the first embodiment.

Also in the semiconductor device according to the modified example of the first embodiment of the present invention, a formation method of the same plane pattern configuration, the same air bridge structure, the same active area, and the same non-active area, as the first embodiment is applicable.

According to the first embodiment and its modified example of the present invention, a semiconductor device, which improves efficiency of heat dissipation, can be provided.

Moreover, according to the first embodiment and its modified example of the present invention, electrode placement, which applies easy heat dispersion of a semiconductor device with high power density and high exothermic density, can be provided.

Moreover, according to the first embodiment and its modified example of the present invention, the electrode placement, which applies easy heat dispersion of a power amplification element with high exothermic densities, such as GaN FETs, can be provided.

Second Embodiment

Figure 6:
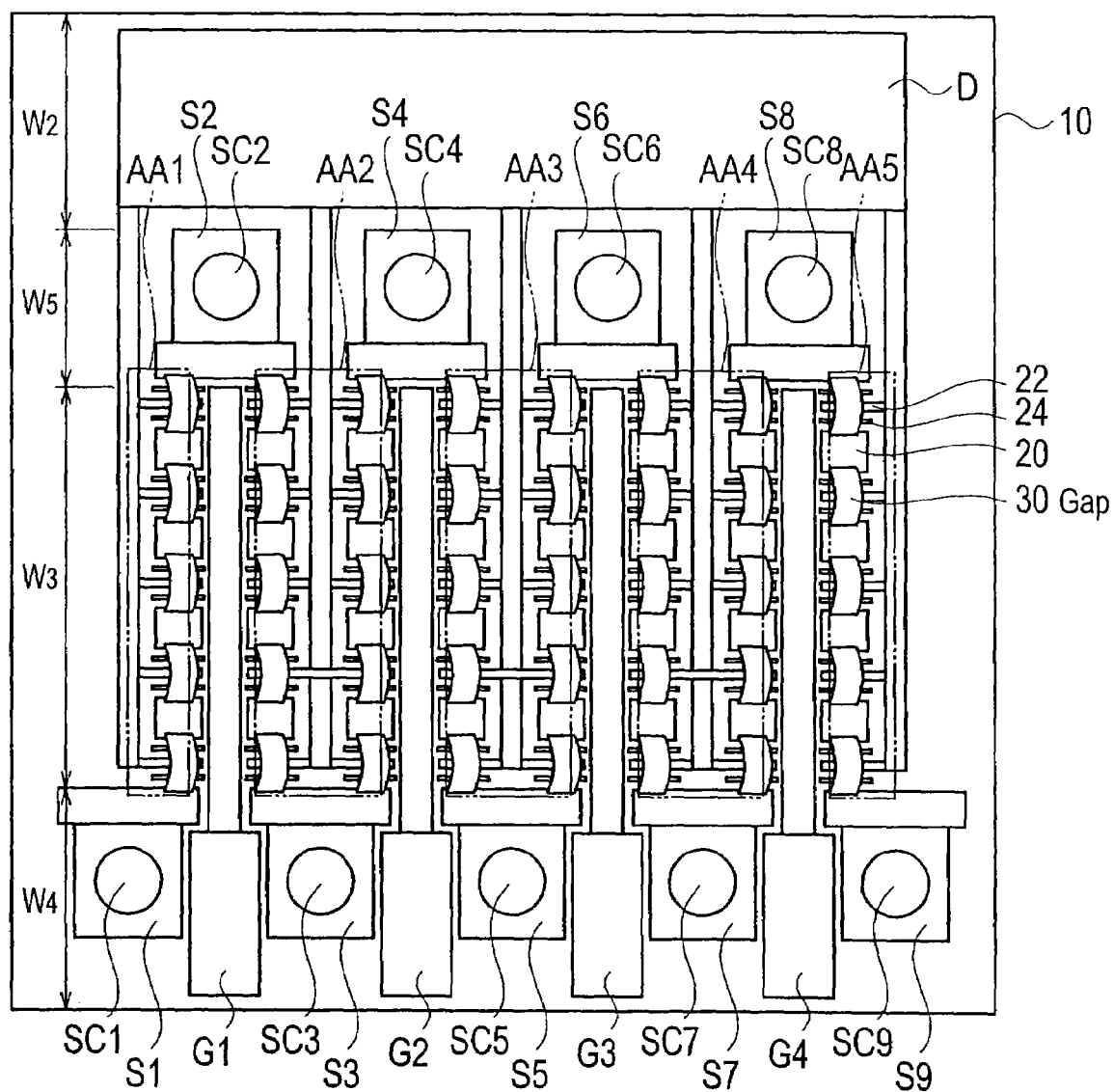
FIG. 6 is a schematic plane pattern configuration diagram showing a semiconductor device according to a second embodiment of the present invention.

A schematic plane pattern configuration of a semiconductor device according to a second embodiment of the present invention is expressed as shown in FIG. 6. The semiconductor device according to the second embodiment of the present invention has a configuration of which a gate electrode 24 and a drain electrode 22 have fishbone placement.

Moreover, as shown in FIG. 6, parts of a source electrode 20 on active areas $AA_1, AA_2, \ldots, AA_5$ of stripe shape of the gate electrode 24 and the drain electrode 22 has the structure of an air bridge 30.

According to the semiconductor device according to the second embodiment of the present invention, parasitic capacitance is reduced by an air gap 14 (air layer) being made between the substrate 10 and the air bridge 30 by applying a part of the source electrode 20 on the active areas $AA_1$, $AA_2, \ldots, AA_5$ into structure of the air bridge 30.

As shown in FIG. 6, the gate electrode 24 of the fishbone placement has structure of connecting the gate electrode 24 into the shape of the fishbone from a wide supply line.

Moreover, as shown in FIG. 6, the drain electrode 22 of the fishbone placement has structure of connecting the drain electrode 22 into the shape of the fishbone from a wide supply line.

As shown in FIG. 6, the semiconductor device according to the second embodiment of the present invention includes: a substrate 10; the gate electrode 24, the source electrode 20, and the drain electrode 22 which are placed on a first surface of the substrate 10 and have a plurality of fingers, respectively; gate terminal electrodes G1, G2, . . . , G4, source terminal electrodes S1, S2, . . . , S9, and a drain terminal electrode D which are placed on the first surface of the substrate 10, and governs and forms a plurality of fingers, respectively every the gate electrode 24, the source electrode 20, and the drain electrode 22; the active areas $AA_1, AA_2, \ldots, AA_5$ placed on the substrate 10 of the lower part of the gate electrode 24, the source electrode 20, and the drain electrode 22; a non-active area BA (not shown) adjoining of the active areas $AA_1, AA_2, \ldots, AA_5$ and placed on the substrate 10 of the lower part of the gate electrode 24, the source electrode 20, and the drain electrode 22; and VIA holes SC1, SC2, . . . , SC9 connected to the source terminal electrodes S1, S2, . . . , S9. Furthermore, the active areas $AA_1, AA_2, \ldots, AA_5$ are divided and placed with a plurality of stripe shapes, and the gate electrodes 24 are formed by fishbone placement and a bus line of the concerned fishbone placement is placed on the non-active area BA of stripe shape, and further the drain electrodes 22 are formed by fishbone placement.

According to the semiconductor device according to the second embodiment of the present invention, as shown in FIG. 6, by dividing the active areas $AA_1, AA_2, \ldots, AA_5$ into stripe shapes, heat sources are distributed and are also placed in the direction which intersects perpendicularly with electrodes as well as electrode spacing. For this reason, a power semiconductor device with sufficient efficiency of heat dissipation can be realized.

Moreover, as shown in FIG. 6, a part of the source electrode 20 on the active areas $AA_1, AA_2, \ldots, AA_5$ of stripe shape of the gate electrode 24 and the drain electrode 22 have the structure of the air bridge 30.

According to the semiconductor device according to the second embodiment of the present invention, parasitic capacitance is reduced by the air gap 14 (air layer) being made between the substrate 10 and the air bridge 30 by applying a part of the source electrode 20 on the active areas $AA_1$, $AA_2, \ldots, AA_5$ into structure of the air bridge 30.

As shown in FIG. 6, phase shifts accompanying transfer of a gate input signal from the gate terminal electrodes G1, G2, . . . , G4 to each unit of the semiconductor device part and transfer of an output signal from each unit of the semiconductor device part to the drain terminal electrode D can be alleviated by applying the gate electrode 24 and the drain electrode 22 into the shape of the fishbone from the wide supply line.

Moreover, conductor loss is reduced by half by connecting the gate electrodes 24 and the drain electrodes 22 into the shapes of the fishbone from the wide supply line.

In the configuration example of FIG. 6, as for the size of each part, for example, W2 is about 80 micrometers, cell length W3 is about 420 micrometers, W4 is about 100 micrometers, and gate width WG is about 3.2 mm (=40 micrometer×10×2×4 cells) as a whole.

Also in the semiconductor device according to the second embodiment of the present invention, a formation method of the same plane pattern configuration, the same air bridge structure, the same active area, and the same non-active area, as the first embodiment is applicable.

Modified Example of Second Embodiment

Figure 7:
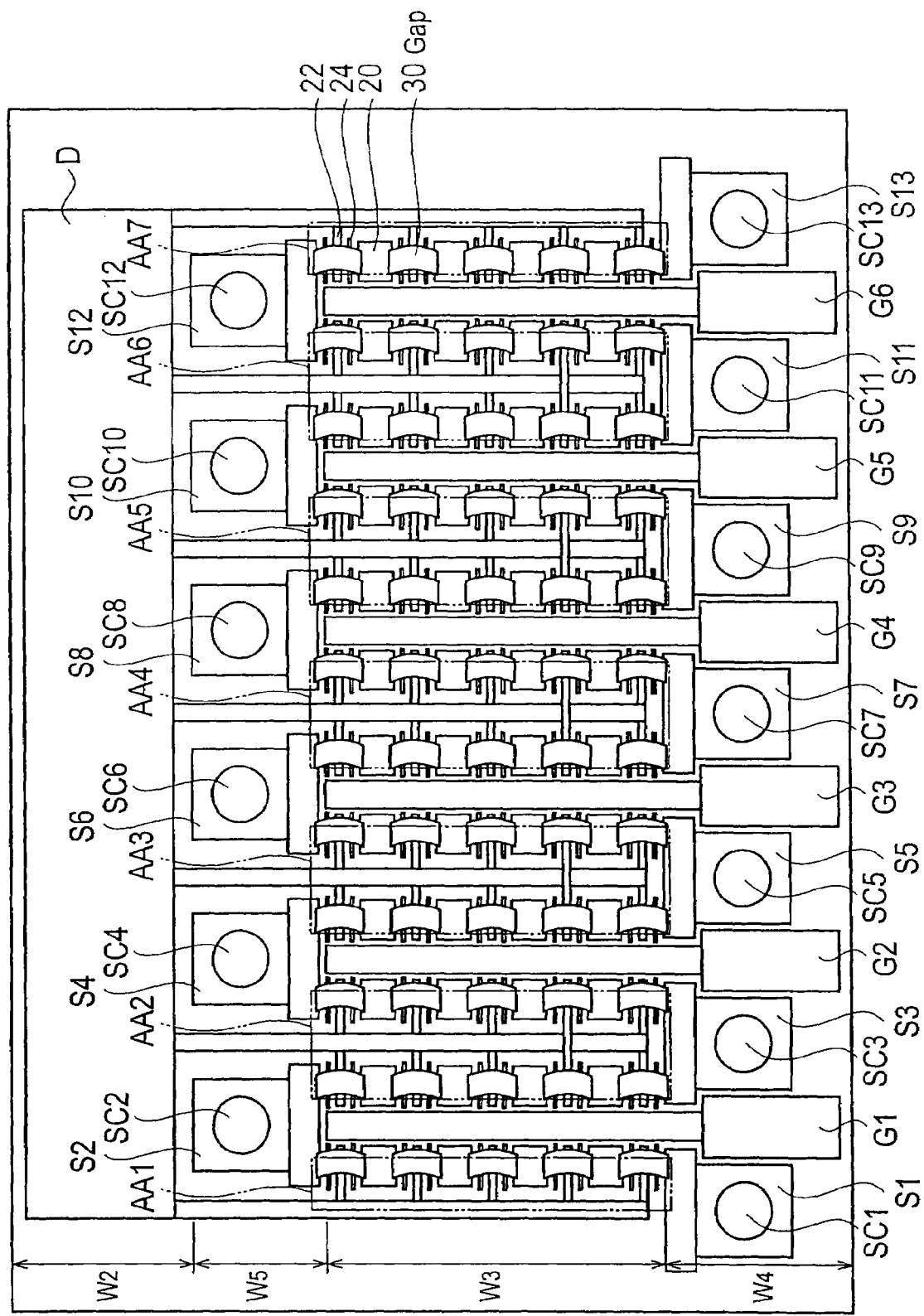
FIG. 7 is a schematic plane pattern configuration diagram showing a semiconductor device according to a modified example of the second embodiment of the present invention.

A schematic plane pattern configuration of a semiconductor device according to a modified example of the second embodiment of the present invention is expressed as shown in FIG. 7.

As shown in FIG. 7, the semiconductor device according to the modified example of the second embodiment of the present invention includes: a substrate 10; a gate electrode 24, a source electrode 20, and a drain electrode 22 which are placed on a first surface of the substrate 10 and have a plurality of fingers, respectively; gate terminal electrodes G1, G2, . . . , G6 and the source terminal electrodes S1, S2, . . . , S13, and the drain terminal electrode D which are placed on the first surface of the substrate 10, and governs and forms a plurality of fingers, respectively every the gate electrode 24, the source electrode 20, and the drain electrode 22; active areas $AA_1, AA_2, \ldots, AA_7$ placed on the substrate 10 of the lower part of the gate electrode 24, the source electrode 20, and the drain electrode 22; non-active area BA (not shown) adjoining of active areas $AA_1, AA_2, \ldots, AA_7$ and placed on the substrate 10 of the lower part of the gate electrode 24, the source electrode 20, and the drain electrode 22; and VIA holes SC1, SC2, . . . , SC13 connected to the source terminal electrode S1, S2, . . . , S13. Furthermore, the active areas $AA_1$, $AA_2, \ldots, AA_7$ are divided and placed with a plurality of stripe shapes, the gate electrodes 24 are formed by fishbone placement and a bus line of the concerned fishbone placement is placed on the non-active areaa BA of stripe shape, and further the drain electrodes 22 are formed by fishbone placement.

According to the semiconductor device according to the modified example of the second embodiment of the present invention, as shown in FIG. 7, by dividing the active areas $AA_1, AA_2, \ldots, AA_7$ into stripe shapes, heat sources are distributed and are also placed in the direction which intersects perpendicularly with electrodes as well as electrode spacing. For this reason, a power semiconductor device with sufficient efficiency of heat dissipation can be realized.

Moreover, as shown in FIG. 7, a part of the source electrode 20 on the active areas $AA_1, AA_2, \ldots, AA_7$ of stripe shape of the gate electrode 24 and the drain electrode 22 have the structure of the air bridge 30.

According to the semiconductor device according to the modified example of the second embodiment of the present invention, parasitic capacitance is reduced by the air gap 14 (air layer) being made between the substrate 10 and the air bridge 30 by applying a part of the source electrode 20 on the active areas $AA_1, AA_2, \ldots, AA_7$ into structure of the air bridge 30.

Moreover, as shown in FIG. 7, the gate electrode 24 and the drain electrode 22 which are the fishbone placements have structure of connecting the gate electrode 24 and the drain electrode 22 into the shape of the fishbone from a wide supply line.

As shown in FIG. 7, phase shifts accompanying transfer of a gate input signal from the gate terminal electrodes G1, G2, ..., G6 to each unit of the semiconductor device part and transfer of an output signal from each unit of the semiconductor device part to the drain terminal electrode D can be alleviated by applying the gate electrode 24 and the drain electrode 22 into the shape of the fishbone from the wide supply line.

Moreover, conductor loss is reduced by half by connecting the gate electrode 24 and the drain electrode 22 into the shape of the fishbone from the wide supply line.

In the configuration example of FIG. 7, as for the size of each part, for example, W2 is about 80 micrometers, cell length W3 is about 420 micrometers, W4 is about 100 micrometers, and gate width WG is about 4.8 mm (=40 micrometer×10×2×6 cells) as a whole.

According to the semiconductor device according to the modified example of the second embodiment of the present invention, it is realized to extend the value of the gate width WG by the fishbone placement of the gate electrodes 24 and the drain electrodes 22, while the value of the gate width WG is reduced in the semiconductor device according to the second embodiment.

Also in the semiconductor device according to the modified example of the second embodiment of the present invention, a formation method of the same plane pattern configuration, the same air bridge structure, the same active area, and the same non-active area, as the first embodiment is applicable.

According to the second embodiment and its modified example of the present invention, a semiconductor device which improves efficiency of heat dissipation can be provided.

Moreover, according to the second embodiment and its modified example of the present invention, electrode placement which applies easy heat dispersion of a semiconductor device with high power density and high exothermic density can be provided.

Moreover, according to the second embodiment and its modified example of the present invention, the electrode placement which applies easy heat dispersion of a power amplification element with high exothermic densities, such as GaN FETs, can be provided.

Other Embodiments

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art.

In addition, it cannot be overemphasized that the amplifying elements are applicable not only to FET but also other amplifying elements, such as HEMT (High Electron Mobility Transistor), LDMOS (Lateral Doped Metal-Oxide-Semiconductor Field Effect Transistor), and HBT (Hetero-junction Bipolar Transistor).

Accordingly, the technical scope of the present invention is defined by the claims that appear appropriate from the above explanation, as well as by the spirit of the invention. Various modifications will become possible for those skilled in the art after receiving the teachings of the present disclosure without departing from the scope thereof.

INDUSTRIAL APPLICABILITY

According to the present invention, a semiconductor device is applied for the semiconductor device with a SiC substrate or a GaN substrate and has a wide range of application fields, such as a power amplifier element with internal matching circuits, a power MMIC (Monolithic Microwave Integrated Circuit), a microwave power amplifier, and a millimeter-wave power amplifier.

What is claimed is:

1. A semiconductor device comprising:
   a substrate;
   a gate electrode, a source electrode, and a drain electrode which are placed on a first surface of the substrate, and have a plurality of fingers, respectively;
   a gate terminal electrode, a source terminal electrode, and a drain terminal electrode which are placed on the first surface of the substrate, and governs and forms a plurality of fingers, respectively for the gate electrode, the source electrode, and the drain electrode;
   an active area placed on the substrate of the lower part of the gate electrode, the source electrode, and the drain electrode;
   a non-active area adjoining the active area and placed on the substrate of the lower part of the gate electrode, the source electrode, and the drain electrode; and
   a via hole connected to the source terminal electrode,
   wherein the active area is divided into a plurality of stripe shapes, and the gate electrodes are formed as fishbone placement, and a bus line of the fishbone placement is placed on the non-active area of stripe shape.

2. The semiconductor device according to claim 1, wherein the drain electrode is also formed as fishbone placement.

3. The semiconductor device according to claim 2, wherein a part of the source electrode on the active area of stripe shape of the gate electrode and the drain electrode has air bridge structure.

4. The semiconductor device according to claim 3, wherein the substrate is at least one of a SiC substrate, a GaN substrate, a substrate in which a GaN epitaxial layer is formed on a SiC substrate, a substrate in which a hetero-junction epitaxial layer composed of GaN/AlGaN is formed on a SiC substrate, a sapphire substrate, and a diamond substrate.

5. The semiconductor device according to claim 2, wherein the gate electrode and the drain electrode connect the gate electrode and the drain electrode in the shape of a fishbone from a wide supply line.

6. The semiconductor device according to claim 5, wherein the substrate is at least one of a SiC substrate, a GaN substrate, a substrate in which a GaN epitaxial layer is formed on a SiC substrate, a substrate in which a heterojunction epitaxial layer composed of GaN/AlGaN is formed on a SiC substrate, a sapphire substrate, and a diamond substrate.

7. The semiconductor device according to claim 2, wherein the substrate is at least one of a SiC substrate, a GaN substrate, a substrate in which a GaN epitaxial layer is formed on a SiC substrate, a substrate in which a heterojunction epitaxial layer composed of GaN/AlGaN is formed on a SiC substrate, a sapphire substrate, and a diamond substrate.

8. The semiconductor device according to claim 2, wherein the substrate is a semiconductor substrate which has conductivity on a surface layer, and the non-active area is formed by ion implantation.

9. The semiconductor device according to claim 2, wherein the substrate is a semiconductor substrate which has conductivity on a surface layer, and the non-active area is formed by mesa etching.

10. The semiconductor device according to claim 2, wherein
the substrate is a semi-insulating semiconductor substrate, and the active area is formed by one of ion implantation and diffusion.

11. The semiconductor device according to claim 2, wherein
the substrate is a semi-insulating semiconductor substrate, the active area is formed by one of ion implantation and diffusion, and the non-active area is formed by ion implantation.

12. The semiconductor device according to claim 1, wherein
a part on the non-active area of stripe shape of one of the source electrode and the drain electrode has air bridge structure.

13. The semiconductor device according to claim 12, wherein
the substrate is at least one of a SiC substrate, a GaN substrate, a substrate in which a GaN epitaxial layer is formed on a SiC substrate, a substrate in which a heterojunction epitaxial layer composed of GaN/AlGaN is formed on a SiC substrate, a sapphire substrate, and a diamond substrate.

14. The semiconductor device according to claim 1, wherein
the gate electrode connects the gate electrode in the shape of a fishbone from a wide supply line.

15. The semiconductor device according to claim 14, wherein
the substrate is at least one of a SiC substrate, a GaN substrate, a substrate in which a GaN epitaxial layer is formed on a SiC substrate, a substrate in which a heterojunction epitaxial layer composed of GaN/AlGaN is formed on a SiC substrate, a sapphire substrate, and a diamond substrate.

16. The semiconductor device according to claim 1, wherein
the substrate is at least one of a SiC substrate, a GaN substrate, a substrate in which a GaN epitaxial layer is formed on a SiC substrate, a substrate in which a heterojunction epitaxial layer composed of GaN/AlGaN is formed on a SiC substrate, a sapphire substrate, and a diamond substrate.

17. The semiconductor device according to claim 1, wherein
the substrate is a semiconductor substrate which has conductivity on a surface layer, and the non-active area is formed by ion implantation.

18. The semiconductor device according to claim 1, wherein
the substrate is a semiconductor substrate which has conductivity on a surface layer, and the non-active area is formed by mesa etching.

19. The semiconductor device according to claim 1, wherein
the substrate is a semi-insulating semiconductor substrate, and the active area is formed by one of ion implantation and diffusion.

20. The semiconductor device according to claim 1, wherein
the substrate is a semi-insulating semiconductor substrate, the active area is formed by one of ion implantation and diffusion, and the non-active area is formed by ion implantation.

* * * * *